(12) United States Patent
Kim

(10) Patent No.: US 12,294,803 B2
(45) Date of Patent: May 6, 2025

(54) IMAGE SENSOR FOR PERFORMING AN ANALOG BINNING OPERATION

(71) Applicant: SK hynix Inc., Gyeonggi-do (KR)

(72) Inventor: Dong Ju Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/296,998

(22) Filed: Apr. 7, 2023

(65) Prior Publication Data
US 2024/0080589 A1 Mar. 7, 2024

(30) Foreign Application Priority Data
Sep. 6, 2022 (KR) .................. 10-2022-0112953

(51) Int. Cl.
*H04N 25/78* (2023.01)
*H01L 27/146* (2006.01)
*H04N 25/46* (2023.01)

(52) U.S. Cl.
CPC ....... *H04N 25/78* (2023.01); *H01L 27/14609* (2013.01); *H04N 25/46* (2023.01)

(58) Field of Classification Search
CPC ...... H04N 25/78; H04N 25/46; H04N 25/767; H04N 25/75; H04N 25/76; H01L 27/14609
See application file for complete search history.

(56) References Cited

U.S. PATENT DOCUMENTS

| | | | | |
|---|---|---|---|---|
| 2020/0154071 | A1* | 5/2020 | Hwang | H04N 25/445 |
| 2020/0322554 | A1* | 10/2020 | Tanaka | H04N 25/618 |
| 2023/0300486 | A1* | 9/2023 | Kim | H04N 25/75 |
| | | | | 348/302 |

* cited by examiner

*Primary Examiner* — Thanh Luu
*Assistant Examiner* — Mai Thi Ngoc Tran
(74) *Attorney, Agent, or Firm* — IP & T GROUP LLP

(57) ABSTRACT

Disclosed is an image sensor including first to fourth, fifth to eighth, ninth to $12^{th}$ and $13^{th}$ to $16^{th}$ unit pixel circuits, a first readout line connected to the first and ninth unit pixel circuits, a second readout line connected to the fifth and $13^{th}$ unit pixel circuits, a third readout line connected to the second and $10^{th}$ unit pixel circuits, a fourth readout line connected to the sixth and $14^{th}$ unit pixel circuits, a fifth readout line connected to the third and $11^{th}$ unit pixel circuits, a sixth readout line connected to the seventh and $15^{th}$ unit pixel circuits, a seventh readout line connected to the fourth and $12^{th}$ unit pixel circuits, an eighth readout line connected to the eighth and $16^{th}$ unit pixel circuits, first to fourth readout circuits, and a path selector connecting the unit pixel circuits to the readout circuits via the readout lines.

14 Claims, 6 Drawing Sheets ic design technique, and more particularly, to an image sensor that supports a binning mode.

IMAGE SENSOR FOR PERFORMING AN ANALOG BINNING OPERATION

CROSS-REFERENCE TO RELATED APPLICATION(S)

This application claims priority under 35 U.S.C. § 119 to Korean Patent Application No. 10-2022-0112953, filed on Sep. 6, 2022, the disclosure of which is incorporated herein by reference in its entirety.

BACKGROUND

1. Field

Various embodiments of the present disclosure relate to a semiconductor design technique, and more particularly, to an image sensor that supports a binning mode.

2. Description of the Related Art

Image sensors are electronic devices for capturing images using the property of a semiconductor, which reacts to light. Image sensors may be classified into charge-coupled device (CCD) image sensors and complementary metal-oxide semiconductor (CMOS) image sensors. Recently, CMOS image sensors are widely used because the CMOS image sensors can allow both analog and digital control circuits to be directly implemented on a single integrated circuit (IC).

SUMMARY

Various embodiments of the present disclosure are directed to an image sensor capable of performing an analog binning operation in a horizontal direction.

In accordance with an embodiment of the present disclosure, an image sensor may include: a first pixel group including first to fourth unit pixel circuits arranged in at least one row; a second pixel group including fifth to eighth unit pixel circuits arranged in at least one other row; a third pixel group including ninth to $12^{th}$ unit pixel circuits arranged in at least one other row; a fourth pixel group including $13^{th}$ to $16^{th}$ unit pixel circuits arranged in at least one other row; a first readout line disposed in a first column and connected to the first unit pixel circuit and the ninth unit pixel circuit; a second readout line disposed in a second column and connected to the fifth unit pixel circuit and the $13^{th}$ unit pixel circuit; a third readout line disposed in a third column and connected to the second unit pixel circuit and the $10^{th}$ unit pixel circuit; a fourth readout line disposed in a fourth column and connected to the sixth unit pixel circuit and the $14^{th}$ unit pixel circuit; a fifth readout line disposed in a fifth column and connected to the third unit pixel circuit and the $11^{th}$ unit pixel circuit; a sixth readout line disposed in a sixth column and connected to the seventh unit pixel circuit and the $15^{th}$ unit pixel circuit; a seventh readout line disposed in a seventh column and connected to the fourth unit pixel circuit and the $12^{th}$ unit pixel circuit; an eighth readout line disposed in an eighth column and connected to the eighth unit pixel circuit and the $16^{th}$ unit pixel circuit; first to fourth readout circuits; and a path selector suitable for connecting the first to $16^{th}$ unit pixel circuits to the first to fourth readout circuits via the first to eighth readout lines during a single row time in a binning mode.

In accordance with an embodiment of the present disclosure, an image sensor may include: a pixel array including N*M unit pixel circuits, where N≥2 and M≥N; K*N readout lines connected to the N*M unit pixel circuits, where K≥2; a signal converter including N readout circuits; and a path selector suitable for connecting the N*M unit pixel circuits to the N readout circuits via the K*N readout lines during a single row time in a binning mode.

In accordance with an embodiment of the present disclosure, an image sensor may include: a pixel array including a plurality of unit pixel circuits; a plurality of readout lines connected to the plurality of unit pixel circuits; a plurality of readout circuits; a first path selection circuit coupled between the plurality of readout lines and the plurality of bias circuits, and suitable for selectively connecting the plurality of readout lines to the plurality of bias circuits on the basis of a plurality of first control signals; a plurality of readout circuits; and a second path selection circuit coupled between the plurality of readout lines and the plurality of readout circuits, and suitable for selectively connecting the plurality of readout lines to the plurality of readout circuits on the basis of a plurality of second control signals.

In accordance with an embodiment of the present disclosure, an image sensor may include: a 4×4 array of unit pixel circuits; and a peripheral circuit configured to average during a single row time: pixel signals output through odd readout lines of respective odd columns of the array to generate a first selection pixel signal, pixel signals output through odd readout lines of respective even columns of the array to generate a second selection pixel signal, pixel signals output through even readout lines of the respective odd columns to generate a third selection pixel signal, and pixel signals output through even readout lines of the respective even columns to generate a fourth selection pixel signal, wherein the unit pixel circuits arranged in odd rows of the array are coupled to the respective even readout lines of the respective columns of the array, and wherein the unit pixel circuit arranged in even rows of the array are coupled to the respective odd readout lines of the respective columns of the array.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
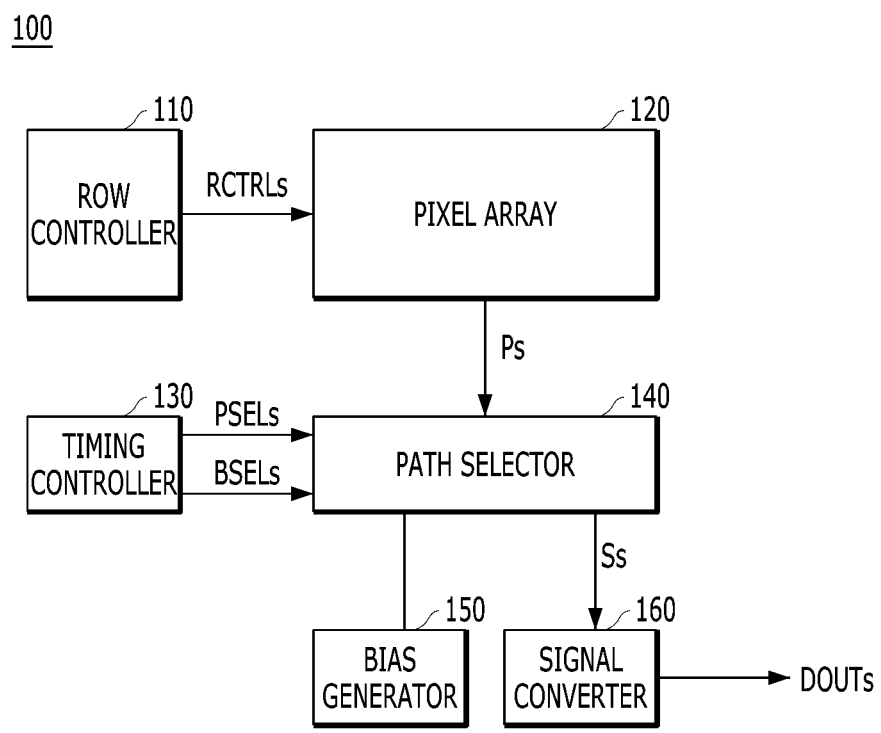
FIG. 1 is a block diagram illustrating an image sensor in accordance with an embodiment of the present disclosure.

FIG. 1 is a block diagram illustrating an image sensor 100 in accordance with a first embodiment of the present disclosure.

Referring to FIG. 1, the image sensor 100 may include a row controller 110, a pixel array 120, a timing controller 130, a path selector 140, a bias generator 150 and a signal converter 160.

The row controller 110 may generate row control signals RCTRLs for controlling the pixel array 120.

The row controller 110 may generate the row control signals RCTRLs for controlling the pixel array 120 for each single row group in a normal mode. For example, the row controller 110 may generate first row control signals for controlling a first unit pixel circuit group arranged in a first row group, for example, first and second rows, of the pixel array 120 during a first single row time, and generate $y^{th}$ row control signals for controlling a $y^{th}$ unit pixel circuit group arranged in a $y^{th}$ row group, for example, 2*y−1 to 2*y rows, of the pixel array 120 during a $y^{th}$ single row time, where "y" is a natural number equal to or greater than 2. The row control signals RCTRLs may include the first to $y^{th}$ row control signals.

The row controller 110 may generate the row control signals RCTRLs for controlling the pixel array 120 by a plurality of row groups in a binning mode. For example, the row controller 110 may generate first to fourth row control signals for controlling first to fourth unit pixel circuit groups arranged in first to fourth row groups, for example, first to eighth rows, of the pixel array 120 during a first single row time, and generate $(y-3)^{th}$ to $y^{th}$ row control signals for controlling $(y-3)^{th}$ to $y^{th}$ unit pixel circuit groups arranged in $(y-3)^{th}$ to $y^{th}$ row groups, for example, 2*y−7 to 2*y rows, of the pixel array 120 during a $(y/4)^{th}$ single row time.

The pixel array 120 may include a plurality of pixels arranged at intersections of a plurality of rows and a plurality of columns. The plurality of pixels may output pixel signals Ps, which correspond to at least one row, through column lines on the basis of the row control signals RCTRLs. The pixel array 120 may include unit pixel circuits, arranged in a grid structure (refer to FIG. 2 or 3).

The timing controller 130 may generate first control signals BSELs and second control signals PSELs. For example, the timing controller 130 may repeatedly generate the first control signals BSELs and the second control signals PSELs during the first to $y^{th}$ single row times in the normal mode, and repeatedly generate the first control signals BSELs and the second control signals PSELs during the first to $(y/4)^{th}$ single row times in the binning mode.

The path selector 140 may provide a path of the pixel signals Ps and a path of biases on the basis of the first control signals BSELs and the second control signals PSELs. The path selector 140 may generate the pixel signals Ps as selection pixel signals Ss in the normal mode, and generate the selection pixel signals Ss by performing an analog binning operation on the pixel signals Ps in the binning mode. For example, the analog binning operation refers to an operation of averaging pixel signals corresponding to the same color filter among the pixel signals Ps. The path selector 140 is described in detail below.

The bias generator 150 may be connected to the pixel array 120 through the path selector 140. For example, the bias generator 150 may generate a bias current so that the pixel signals Ps may be read out through the column lines. The bias generator 150 is described in detail below.

The signal converter 160 may convert the selection pixel signals Ss transmitted from the path selector 140 into digital signals DOUTs. For example, the signal converter 160 may include an analog to digital converter.

Figure 2:
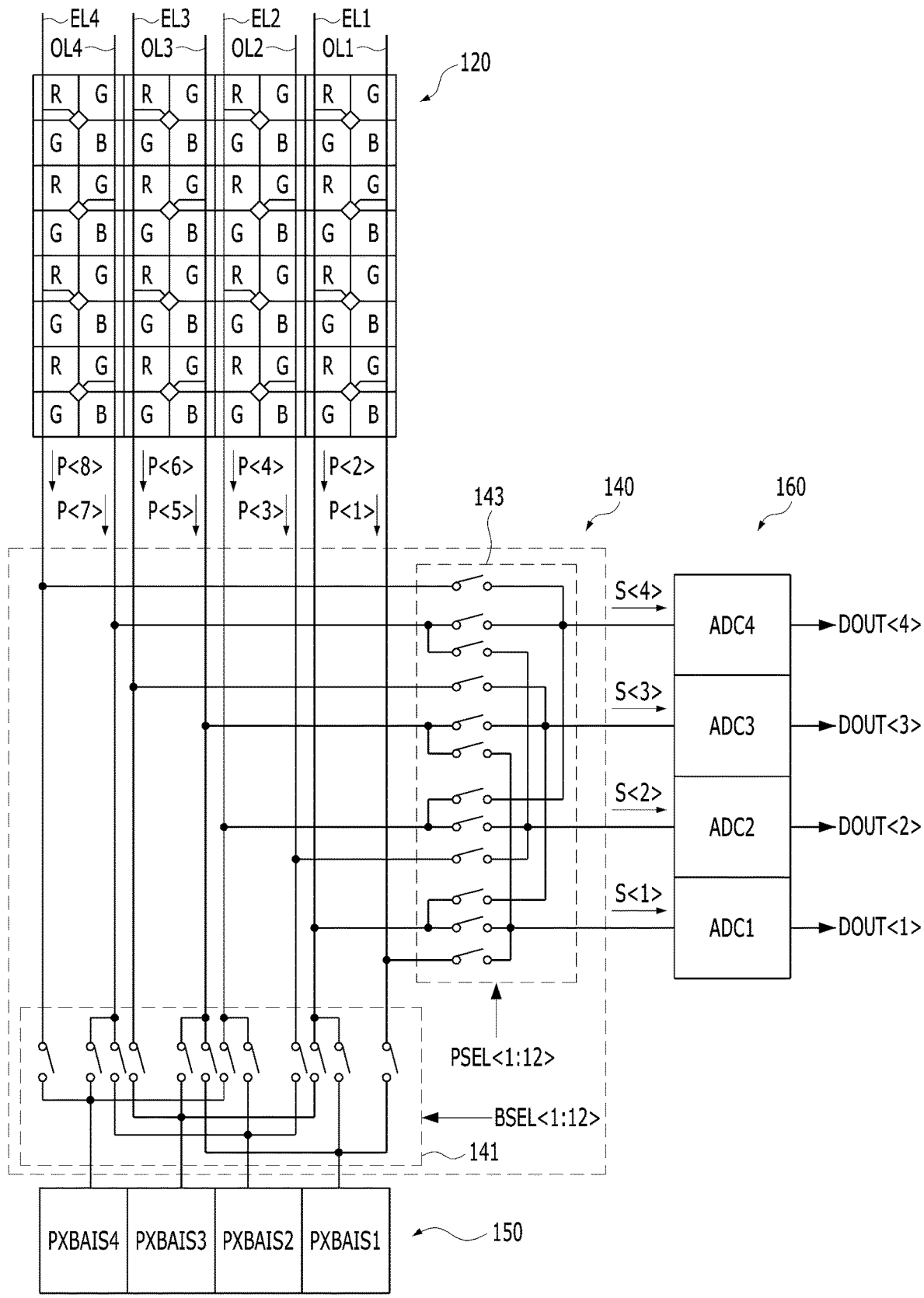
FIG. 2 is a block diagram illustrating an example of a pixel array, a path selector, a bias generator and a signal converter illustrated in FIG. 1 in accordance with an embodiment of the present disclosure.

FIG. 2 is a block diagram illustrating an example of the pixel array 120, the path selector 140, the bias generator 150 and the signal converter 160 illustrated in FIG. 1 in accordance with an embodiment of the present disclosure. For convenience in description, FIG. 2 illustrates only a portion of each of the pixel array 120, the path selector 140, the bias generator 150 and the signal converter 160.

Referring to FIG. 2, the pixel array 120 may include first to $16^{th}$ unit pixel circuits.

The first to fourth unit pixel circuits may be included in the first unit pixel circuit group. That is, the first to fourth unit pixel circuits may be arranged in the first row group, for example, the first and second rows. Each of the first to fourth unit pixel circuits may include four pixels arranged in a 2*2 structure. Each of the first to fourth unit pixel circuits may have a structure in which a plurality of photodiodes share one floating diffusion node. For example, each of the first to fourth unit pixel circuits may have a structure in which four photodiodes corresponding to the 2*2 structure share one floating diffusion node. The first unit pixel circuit may be connected to a first column line OL1, and output a first pixel signal P<1> through the first column line OL1. For example, the first unit pixel circuit may sequentially output four pixel signals, which correspond to first to fourth pixels, as the first pixel signal P<1>. The second unit pixel circuit may be connected to a third column line OL2, and output a third pixel signal P<3> through the third column line OL2. For example, the second unit pixel circuit may sequentially output four pixel signals, which correspond to fifth to eighth pixels, as the third pixel signal P<3>. The third unit pixel circuit may be connected to a fifth column line OL3, and output a fifth pixel signal P<5> through the fifth column line OL3. For example, the third unit pixel circuit may sequentially output four pixel signals, which correspond to ninth to $12^{th}$ pixels, as the fifth pixel signal P<5>. The fourth unit pixel circuit may be connected to a seventh column line OL4, and output a seventh pixel signal P<7> through the seventh column line OL4. For example, the fourth unit pixel circuit may sequentially output four pixel signals, which correspond to $13^{th}$ to $16^{th}$ pixels, as the seventh pixel signal P<7>.

The fifth to eighth unit pixel circuits may be included in the second unit pixel circuit group. That is, the fifth to eighth unit pixel circuits may be arranged in the second row group, for example, the third and fourth rows. Each of the fifth to eighth unit pixel circuits may include four pixels arranged in the 2*2 structure. The fifth unit pixel circuit may be connected to a second column line EL1, and output a second pixel signal P<2> through the second column line EL1. For example, the fifth unit pixel circuit may sequentially output four pixel signals, which correspond to $17^{th}$ to $20^{th}$ pixels, as the second pixel signal P<2>. The sixth unit pixel circuit may be connected to a fourth column line EL2, and output a fourth pixel signal P<4> through the fourth column line EL2. For example, the sixth unit pixel circuit may sequentially output four pixel signals, which correspond to $21^{st}$ to $24^{th}$ pixels, as the fourth pixel signal P<4>. The seventh unit pixel circuit may be connected to a sixth column line EL3, and output a sixth pixel signal P<6> through the sixth column line EL3. For example, the seventh unit pixel circuit may sequentially output four pixel signals, which correspond to $25^{th}$ to $28^{th}$ pixels, as the sixth pixel signal P<6>. The eighth unit pixel circuit may be connected to an eighth column line EL4, and output an eighth pixel signal P<8> through the eighth column line EL4. For example, the eighth unit pixel circuit may sequentially output four pixel signals, which correspond to $29^{th}$ to $32^{nd}$ pixels, as the eighth pixel signal P<8>.

The ninth to $12^{th}$ unit pixel circuits may be included in the third unit pixel circuit group. That is, the ninth to $12^{th}$ unit pixel circuits may be arranged in the third row group, for example, the fifth and sixth rows. Each of the ninth to $12^{th}$ unit pixel circuits may include four pixels arranged in the 2*2 structure. The ninth unit pixel circuit may be connected to the first column line OL1, and output the first pixel signal P<1> through the first column line OL1. For example, the ninth unit pixel circuit may sequentially output four pixel signals, which correspond to $33^{rd}$ to $36^{th}$ pixels, as the first pixel signal P<1>. The $10^{th}$ unit pixel circuit may be connected to the third column line OL2, and output the third pixel signal P<3> through the third column line OL2. For example, the $10^{th}$ unit pixel circuit may sequentially output four pixel signals, which correspond to $37^{th}$ to $40^{th}$ pixels, as the third pixel signal P<3>. The $11^{th}$ unit pixel circuit may be connected to the fifth column line OL3, and output the fifth pixel signal P<5> through the fifth column line OL3. For example, the $11^{th}$ unit pixel circuit may sequentially output four pixel signals, which correspond to $41^{st}$ to $44^{th}$ pixels, as the fifth pixel signal P<5>. The $12^{th}$ unit pixel circuit may be connected to the seventh column line OL4, and output the seventh pixel signal P<7> through the seventh column line OL4. For example, the $12^{th}$ unit pixel circuit may sequentially output four pixel signals, which correspond to $45^{th}$ to $48^{th}$ pixels, as the seventh pixel signal P<7>.

The $13^{th}$ to $16^{th}$ unit pixel circuits may be included in the fourth unit pixel circuit group. That is, the $13^{th}$ to $16^{th}$ unit pixel circuits may be arranged in the fourth row group, for example, the seventh and eighth rows. Each of the $13^{th}$ to $16^{th}$ unit pixel circuits may include four pixels arranged in the 2*2 structure. The $13^{th}$ unit pixel circuit may be connected to the second column line EL1, and output the second pixel signal P<2> through the second column line EL1. For example, the $13^{th}$ unit pixel circuit may sequentially output four pixel signals, which correspond to $49^{th}$ to $52^{nd}$ pixels, as the second pixel signal P<2>. The $14^{th}$ unit pixel circuit may be connected to the fourth column line EL2, and output the fourth pixel signal P<4> through the fourth column line EL2. For example, the $14^{th}$ unit pixel circuit may sequentially output four pixel signals, which correspond to $53^{rd}$ to $56^{th}$ pixels, as the fourth pixel signal P<4>. The $15^{th}$ unit pixel circuit may be connected to the sixth column line EL3, and output the sixth pixel signal P<6> through the sixth column line EL3. For example, the $15^{th}$ unit pixel circuit may sequentially output four pixel signals, which correspond to $57^{th}$ to $60^{th}$ pixels, as the sixth pixel signal P<6>. The $16^{th}$ unit pixel circuit may be connected to the eighth column line EL4, and output the eighth pixel signal P<8> through the eighth column line EL4. For example, the $16^{th}$ unit pixel circuit may sequentially output four pixel signals, which correspond to $61^{st}$ to $64^{th}$ pixels, as the eighth pixel signal P<8>.

Although the present embodiment describes as an example that each unit pixel circuit includes pixels arranged in the 2*2 structure, the present disclosure is not necessarily limited thereto, and the present embodiment may also be applied to a unit pixel circuit including pixels arranged in another structure, for example, 2*4, 3*3, etc.

The bias generator 150 may include first to fourth bias circuits PXBIAS1 to PXBIAS4. The first to fourth bias circuits PXBIAS1 to PXBIAS4 may be configured to have the same number as the number of unit pixel circuits, for example, the first to fourth unit pixel circuits, arranged for each row group, for example, the first row group. The first to fourth bias circuits PXBIAS1 to PXBIAS4 may be selectively connected to first to eighth readout lines OL1 to OL4 and EL1 to EL4 via the path selector 140. For example, each of the first to fourth bias circuits PXBIAS1 to PXBIAS4 may include a current source.

The signal converter 160 may include first to fourth readout circuits ADC1 to ADC4. The first to fourth readout circuits ADC1 to ADC4 may be configured to have the same number as the number of unit pixel circuits, for example, the first to fourth unit pixel circuits, arranged for each row group, for example, the first row group. The first to fourth bias circuits PXBIAS1 to PXBIAS4 may be selectively connected to the first to eighth readout lines OL1 to OL4 and EL1 to EL4 via the path selector 140.

The path selector 140 may include first and second path selection circuits 141 and 143.

The first path selection circuit 141 may be coupled between the first to eighth readout lines OL1 to OL4 and EL1 to EL4 and the first to fourth bias circuits PXBIAS1 to PXBIAS4. The first path selection circuit 141 may selectively connect the first to eighth readout lines OL1 to OL4 and EL1 to EL4 to the first to fourth bias circuits PXBIAS1 to PXBIAS4 on the basis of a plurality of first control signals BSEL<1:12>. The plurality of first control signals BSEL<1:12> may correspond to the plurality of first control signals BSELs illustrated in FIG. 1. The first path selection circuit 141 may selectively connect one of the readout lines to one of the bias circuits for each single row time in the normal mode. For example, in the normal mode, the first path selection circuit 141 may alternately connect the odd-numbered readout lines OL1 to OL4 and the even-numbered readout lines EL0 to EL4 to the first to fourth bias circuits PXBIAS1 to PXBIAS4. The first path selection circuit 141 may selectively connect two or more of the readout lines to one of the bias circuits for each single row time in the binning mode. For example, in the binning mode, the first path selection circuit 141 may connect the first and fifth readout lines OL1 and OL3 to the first bias circuit PXBIAS1, connect the second and sixth readout lines EL1 and EL3 to the third bias circuit PXBIAS3, connect the third and seventh readout lines OL2 and OL4 to the second bias circuit PXBIAS2, and connect the fourth and eighth readout lines EL2 and EL4 to the fourth bias circuit PXBIAS4. For example, the first path selection circuit 141 may include first to $12^{th}$ bias switches.

The first bias switch may be coupled between the first readout line OL1 and the first bias circuit PXBIAS1. The first bias switch may selectively connect the first readout line OL1 to the first bias circuit PXBIAS1 on the basis of the first control signal BSEL<1> among the plurality of first control signals BSEL<1:12>.

The second bias switch may be coupled between the second readout line EL1 and the first bias circuit PXBIAS1. The second bias switch may selectively connect the second readout line EL1 to the first bias circuit PXBIAS1 on the basis of the second control signal BSEL<2> among the plurality of first control signals BSEL<1:12>.

The third bias switch may be coupled between the second readout line EL1 and the third bias circuit PXBIAS3. The third bias switch may selectively connect the second readout line EL1 to the third bias circuit PXBIAS3 on the basis of the third control signal BSEL<3> among the plurality of first control signals BSEL<1:12>.

The fourth bias switch may be coupled between the third readout line OL2 and the second bias circuit PXBIAS2. The fourth bias switch may selectively connect the third readout line OL2 to the second bias circuit PXBIAS2 on the basis of the fourth control signal BSEL<4> among the plurality of first control signals BSEL<1:12>.

The fifth bias switch may be coupled between the fourth readout line EL2 and the second bias circuit PXBIAS2. The fifth bias switch may selectively connect the fourth readout line EL2 to the second bias circuit PXBIAS2 on the basis of the fifth control signal BSEL<5> among the plurality of first control signals BSEL<1:12>.

The sixth bias switch may be coupled between the fourth readout line EL2 and the fourth bias circuit PXBIAS4. The sixth bias switch may selectively connect the fourth readout line EL2 to the fourth bias circuit PXBIAS4 on the basis of the sixth control signal BSEL<6> among the plurality of first control signals BSEL<1:12>.

The seventh bias switch may be coupled between the fifth readout line OL3 and the first bias circuit PXBIAS1. The seventh bias switch may selectively connect the fifth readout line OL3 to the first bias circuit PXBIAS1 on the basis of the seventh control signal BSEL<7> among the plurality of first control signals BSEL<1:12>.

The eighth bias switch may be coupled between the fifth readout line OL3 and the third bias circuit PXBIAS3. The eighth bias switch may selectively connect the fifth readout line OL3 to the third bias circuit PXBIAS3 on the basis of the eighth control signal BSEL<8> among the plurality of first control signals BSEL<1:12>.

The ninth bias switch may be coupled between the sixth readout line EL3 and the third bias circuit PXBIAS3. The ninth bias switch may selectively connect the sixth readout line EL3 to the third bias circuit PXBIAS3 on the basis of the ninth control signal BSEL<9> among the plurality of first control signals BSEL<1:12>.

The $10^{th}$ bias switch may be coupled between the seventh readout line OL4 and the fourth bias circuit PXBIAS4. The $10^{th}$ bias switch may selectively connect the seventh readout line OL4 to the fourth bias circuit PXBIAS4 on the basis of the $10^{th}$ control signal BSEL<10> among the plurality of first control signals BSEL<1:12>.

The $11^{th}$ bias switch may be coupled between the seventh readout line OL4 and the fourth bias circuit PXBIAS4. The $11^{th}$ bias switch may selectively connect the seventh readout line OL4 to the fourth bias circuit PXBIAS4 on the basis of the $11^{th}$ control signal BSEL<11> among the plurality of first control signals BSEL<1:12>.

The $12^{th}$ bias switch may be coupled between the eighth readout line EL4 and the fourth bias circuit PXBIAS4. The $12^{th}$ bias switch may selectively connect the eighth readout line EL4 to the fourth bias circuit PXBIAS4 on the basis of the $12^{th}$ control signal BSEL<12> among the plurality of first control signals BSEL<1:12>.

The second path selection circuit 143 may be coupled between the first to eighth readout lines OL1 to OL4 and EL1 to EL4 and the first to fourth readout circuits ADC1 to ADC4. The second path selection circuit 143 may selectively connect the first to eighth readout lines OL1 to OL4 and EL1 to EL4 to the first to fourth readout circuits ADC1 to ADC4 on the basis of a plurality of second control signals PSEL<1:12>. The plurality of second control signals PSEL<1:12> may correspond to the plurality of second control signals PSELs illustrated in FIG. 1. The second path selection circuit 143 may selectively connect one of the readout lines to one of the readout circuits for each single row time in the normal mode. For example, in the normal mode, the second path selection circuit 143 may alternately connect odd-numbered readout lines OL1 to OL4 and even-numbered readout lines EL0 to EL4 to the first to fourth readout circuits ADC1 to ADC4. The second path selection circuit 143 may selectively connect two or more of the readout lines to one of the readout circuits for each single row time in the binning mode. For example, in the binning mode, the second path selection circuit 143 may connect the first and fifth readout lines OL1 and OL3 to the first readout circuit ADC1, connect the second and sixth readout lines EL1 and EL3 to the third readout circuit ADC3, connect the third and seventh readout lines OL2 and OL4 to the second readout circuit ADC2, and connect the fourth and eighth readout lines EL2 and EL4 to the fourth readout circuit ADC4. For example, the second path selection circuit 143 may include first to $12^{th}$ transfer switches.

The first transfer switch may be coupled between the first readout line OL1 and the first readout circuit ADC1. The first transfer switch may selectively connect the first readout line OL1 to the first readout circuit ADC1 on the basis of the first control signal PSEL<1> among the plurality of second control signals PSEL<1:12>.

The second transfer switch may be coupled between the second readout line EL1 and the first readout circuit ADC1. The second transfer switch may selectively connect the second readout line EL1 to the first readout circuit ADC1 on the basis of the second control signal PSEL<2> among the plurality of second control signals PSEL<1:12>.

The third transfer switch may be coupled between the second readout line EL1 and the third readout circuit ADC3. The third transfer switch may selectively connect the second readout line EL1 to the third readout circuit ADC3 on the basis of the third control signal PSEL<3> among the plurality of second control signals PSEL<1:12>.

The fourth transfer switch may be coupled between the third readout line OL2 and the second readout circuit ADC2. The fourth transfer switch may selectively connect the third readout line OL2 to the second readout circuit ADC2 on the basis of the fourth control signal PSEL<4> among the plurality of second control signals PSEL<1:12>.

The fifth transfer switch may be coupled between the fourth readout line EL2 and the second readout circuit ADC2. The fifth transfer switch may selectively connect the fourth readout line EL2 to the second readout circuit ADC2 on the basis of the fifth control signal PSEL<5> among the plurality of second control signals PSEL<1:12>.

The sixth transfer switch may be coupled between the fourth readout line EL2 and the fourth readout circuit ADC4. The sixth transfer switch may selectively connect the fourth readout line EL2 to the fourth readout circuit ADC4 on the basis of the sixth control signal PSEL<6> among the plurality of second control signals PSEL<1:12>.

The seventh transfer switch may be coupled between the fifth readout line OL3 and the first readout circuit ADC1.

The seventh transfer switch may selectively connect the fifth readout line OL3 to the first readout circuit ADC1 on the basis of the seventh control signal PSEL<7> among the plurality of second control signals PSEL<1:12>.

The eighth transfer switch may be coupled between the fifth readout line OL3 and the third readout circuit ADC3. The eighth transfer switch may selectively connect the fifth readout line OL3 to the third readout circuit ADC3 on the basis of the eighth control signal PSEL<8> among the plurality of second control signals PSEL<1:12>.

The ninth transfer switch may be coupled between the sixth readout line EL3 and the third readout circuit ADC3. The ninth transfer switch may selectively connect the sixth readout line EL3 to the third readout circuit ADC3 on the basis of the ninth control signal PSEL<9> among the plurality of second control signals PSEL<1:12>.

The $10^{th}$ transfer switch may be coupled between the seventh readout line OL4 and the fourth readout circuit ADC4. The $10^{th}$ transfer switch may selectively connect the seventh readout line OL4 to the fourth readout circuit ADC4 on the basis of the $10^{th}$ control signal PSEL<10> among the plurality of second control signals PSEL<1:12>.

The $11^{th}$ transfer switch may be coupled between the seventh readout line OL4 and the fourth readout circuit ADC4. The $11^{th}$ transfer switch may selectively connect the seventh readout line OL4 to the fourth readout circuit ADC4 on the basis of the $11^{th}$ control signal PSEL<11> among the plurality of second control signals PSEL<1:12>.

The $12^{th}$ transfer switch may be coupled between the eighth readout line EL4 and the fourth readout circuit ADC4. The $12^{th}$ transfer switch may selectively connect the eighth readout line EL4 to the fourth readout circuit ADC4 on the basis of the $12^{th}$ control signal PSEL<12> among the plurality of second control signals PSEL<1:12>.

Figure 3:
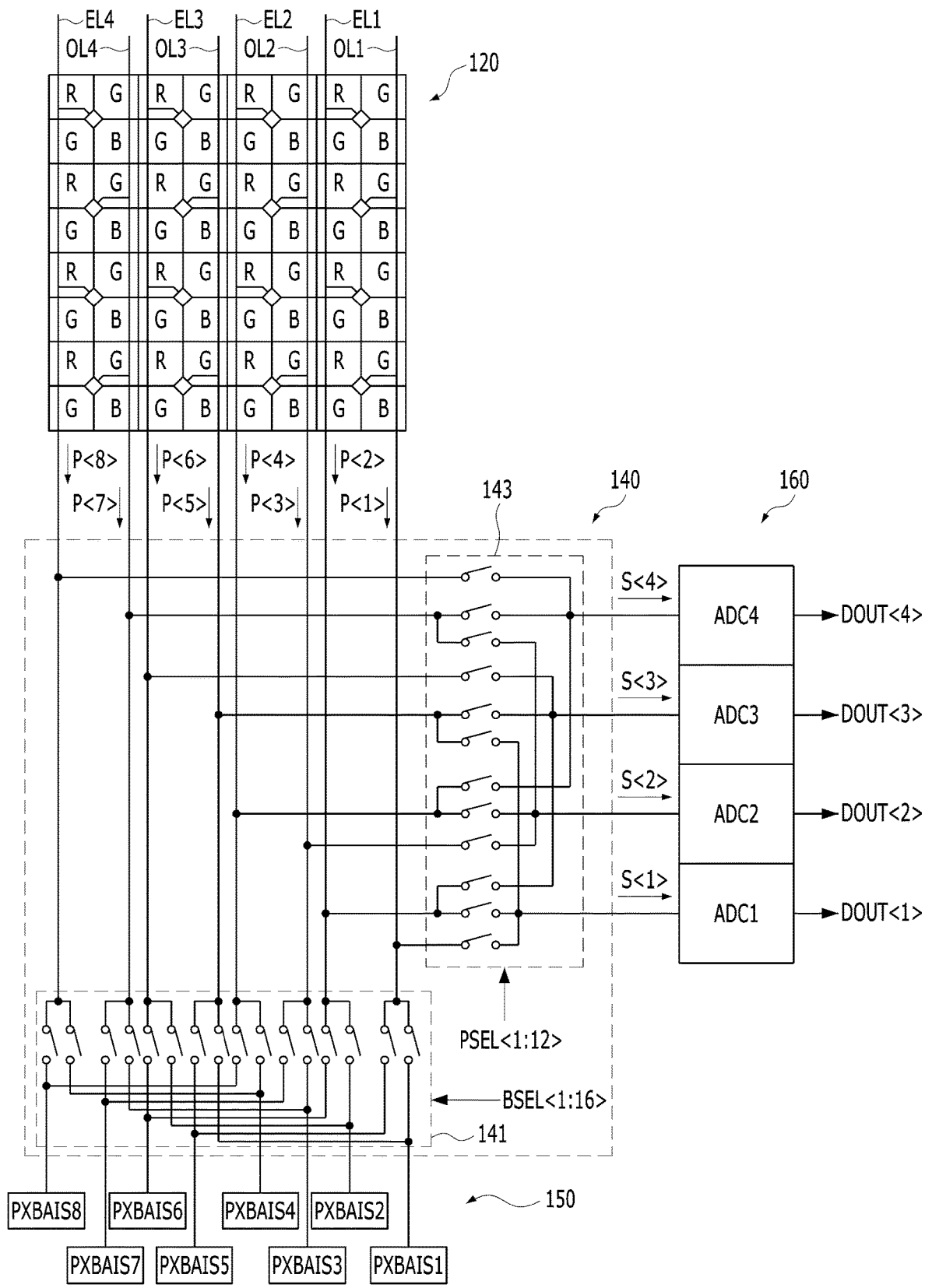
FIG. 3 is a block diagram illustrating another example of the pixel array, the path selector, the bias generator and the signal converter illustrated in FIG. 1 in accordance with an embodiment of the present disclosure.

FIG. 3 is a block diagram illustrating another example of the pixel array 120, the path selector 140, the bias generator 150 and the signal converter 160 illustrated in FIG. 1 in accordance with an embodiment of the present disclosure. For convenience in description, FIG. 3 illustrates only a portion of each of the pixel array 120, the path selector 140, the bias generator 150 and the signal converter 160. Since the pixel array 120 and the signal converter 160 illustrated in FIG. 3 are the same as the pixel array 120 and the signal converter 160 illustrated in FIG. 2, only the path selector 140 and the bias generator 150 are described below.

Referring to FIG. 3, the bias generator 150 may include first to eighth bias circuits PXBIAS1 to PXBIAS8. In particular, the first to eighth bias circuits PXBIAS1 to PXBIAS8 may be one-to-one connected to the first to eighth readout lines OL1 to OL4 and EL1 to EL4 in the binning mode. Accordingly, settling time of first to eighth pixel signals P<1:8> is reduced so that readout speeds of the first to eighth pixel signals P<1:8> may be improved. For example, each of the first to eighth bias circuits PXBIAS1 to PXBIAS8 may include a current source.

The path selector 140 may include a first path selection circuit 141 and a second path selection circuit 143. Since the second path selection circuit 143 is the same as the second path selection circuit 143 illustrated in FIG. 2, only the first path selection circuit 141 is described below.

The first path selection circuit 141 may be coupled between the first to eighth readout lines OL1 to OL4 and EL1 to EL4 and the first to eighth bias circuits PXBIAS1 to PXBIAS8. The first path selection circuit 141 may selectively connect the first to eighth readout lines OL1 to OL4 and EL1 to EL4 to the first to eighth bias circuits PXBIAS1 to PXBIAS8 on the basis of a plurality of first control signals BSEL<1:16>. The plurality of first control signals BSEL<1:16> may correspond to the plurality of first control signals BSELs illustrated in FIG. 1. The first path selection circuit 141 may connect one of the readout lines to one of the bias circuits for each single row time in the normal mode. For example, in the normal mode, the first path selection circuit 141 may connect odd-numbered readout lines OL1 to OL4 to odd-numbered bias circuits PXBIAS1, PXBIAS3, PXBIAS5 and PXBIAS7, and connect even-numbered readout lines EL0 to EL4 to even-numbered bias circuits PXBIAS2, PXBIAS4, PXBIAS6 and PXBIAS8. The first path selection circuit 141 may selectively connect one of the readout lines to one of the bias circuits for each single row time in the binning mode. That is, first to $16^{th}$ bias switches may one-to-one connect the first to eighth readout lines OL1 to OL4 and EL1 to EL4 to the first to eighth bias circuits PXBIAS1 to PXBIAS8 in the binning mode. For example, in the binning mode, the first path selection circuit 141 may cross-connect the first and fifth readout lines OL1 and OL3 to the first and fifth bias circuits PXBIAS1 and PXBIAS5, cross-connect the second and six readout lines EL1 and EL3 to the second and sixth bias circuits PXBIAS2 and PXBIAS6, cross-connect the third and seventh readout lines OL2 and OL4 to the third and seventh bias circuits PXBIAS3 and PXBIAS7, and cross-connect the fourth and eighth readout lines EL2 and EL4 to the fourth and eighth bias circuits PXBIAS4 and PXBIAS8. For example, the first path selection circuit 141 may include the first to $16^{th}$ bias switches.

The first bias switch may be coupled between the first readout line OL1 and the first bias circuit PXBIAS1. The first bias switch may selectively connect the first readout line OL1 to the first bias circuit PXBIAS1 on the basis of the first control signal BSEL<1> among the plurality of first control signals BSEL<1:16>.

The second bias switch may be coupled between the first readout line OL1 and the fifth bias circuit PXBIAS5. The second bias switch may selectively connect the first readout line OL1 to the fifth bias circuit PXBIAS5 on the basis of the second control signal BSEL<2> among the plurality of first control signals BSEL<1:16>.

The third bias switch may be coupled between the second readout line EL1 and the second bias circuit PXBIAS2. The third bias switch may selectively connect the second readout line EL1 to the second bias circuit PXBIAS2 on the basis of the third control signal BSEL<3> among the plurality of first control signals BSEL<1:16>.

The fourth bias switch may be coupled between the second readout line EL1 and the sixth bias circuit PXBIAS6. The fourth bias switch may selectively connect the second readout line EL1 to the sixth bias circuit PXBIAS6 on the basis of the fourth control signal BSEL<4> among the plurality of first control signals BSEL<1:16>.

The fifth bias switch may be coupled between the third readout line OL2 and the third bias circuit PXBIAS3. The fifth bias switch may selectively connect the third readout line OL2 to the third bias circuit PXBIAS3 on the basis of the fifth control signal BSEL<5> among the plurality of first control signals BSEL<1:16>.

The sixth bias switch may be coupled between the third readout line OL2 and the seventh bias circuit PXBIAS7. The sixth bias switch may selectively connect the third readout line OL2 to the seventh bias circuit PXBIAS7 on the basis of the sixth control signal BSEL<6> among the plurality of first control signals BSEL<1:16>.

The seventh bias switch may be coupled between the fourth readout line EL2 and the fourth bias circuit PXBIAS4. The seventh bias switch may selectively connect the fourth readout line EL2 to the fourth bias circuit PXBIAS4 on the basis of the seventh control signal BSEL<7> among the plurality of first control signals BSEL<1:16>.

The eighth bias switch may be coupled between the fourth readout line EL2 and the eighth bias circuit PXBIAS8. The eighth bias switch may selectively connect the fourth readout line EL2 to the eighth bias circuit PXBIAS8 on the basis of the eighth control signal BSEL<8> among the plurality of first control signals BSEL<1:16>.

The ninth bias switch may be coupled between the fifth readout line OL3 and the first bias circuit PXBIAS1. The ninth bias switch may selectively connect the fifth readout line OL3 to the first bias circuit PXBIAS1 on the basis of the ninth control signal BSEL<9> among the plurality of first control signals BSEL<1:16>.

The $10^{th}$ bias switch may be coupled between the fifth readout line OL3 and the fifth bias circuit PXBIAS5. The $10^{th}$ bias switch may selectively connect the fifth readout line OL3 to the fifth bias circuit PXBIAS5 on the basis of the $10^{th}$ control signal BSEL<10> among the plurality of first control signals BSEL<1:16>.

The $11^{th}$ bias switch may be coupled between the sixth readout line EL3 and the second bias circuit PXBIAS2. The $11^{th}$ bias switch may selectively connect the sixth readout line EL3 to the second bias circuit PXBIAS2 on the basis of the $11^{th}$ control signal BSEL<11> among the plurality of first control signals BSEL<1:16>.

The $12^{th}$ bias switch may be coupled between the sixth readout line EL3 and the sixth bias circuit PXBIAS6. The $12^{th}$ bias switch may selectively connect the sixth readout line EL3 to the sixth bias circuit PXBIAS6 on the basis of the $12^{th}$ control signal BSEL<12> among the plurality of first control signals BSEL<1:16>.

The $13^{th}$ bias switch may be coupled between the seventh readout line OL4 and the third bias circuit PXBIAS3. The $13^{th}$ bias switch may selectively connect the seventh readout line OL4 to the third bias circuit PXBIAS3 on the basis of the $13^{th}$ control signal BSEL<13> among the plurality of first control signals BSEL<1:16>.

The $14^{th}$ bias switch may be coupled between the seventh readout line OL4 and the seventh bias circuit PXBIAS7. The $14^{th}$ bias switch may selectively connect the seventh readout line OL4 to the seventh bias circuit PXBIAS7 on the basis of the $14^{th}$ control signal BSEL<14> among the plurality of first control signals BSEL<1:16>.

The $15^{th}$ bias switch may be coupled between the eighth readout line EL4 and the fourth bias circuit PXBIAS4. The $15^{th}$ bias switch may selectively connect the eighth readout line EL4 to the fourth bias circuit PXBIAS4 on the basis of the $15^{th}$ control signal BSEL<15> among the plurality of first control signals BSEL<1:16>.

The $16^{th}$ bias switch may be coupled between the eighth readout line EL4 and the eighth bias circuit PXBIAS8. The $16^{th}$ bias switch may selectively connect the eighth readout line EL4 to the eighth bias circuit PXBIAS8 on the basis of the $16^{th}$ control signal BSEL<16> among the plurality of first control signals BSEL<1:16>.

Hereinafter, an operation of the image sensor 100 in accordance with an embodiment of the present disclosure, which has the above-described configuration, is described with reference to FIGS. 4 to 6.

Figure 4:
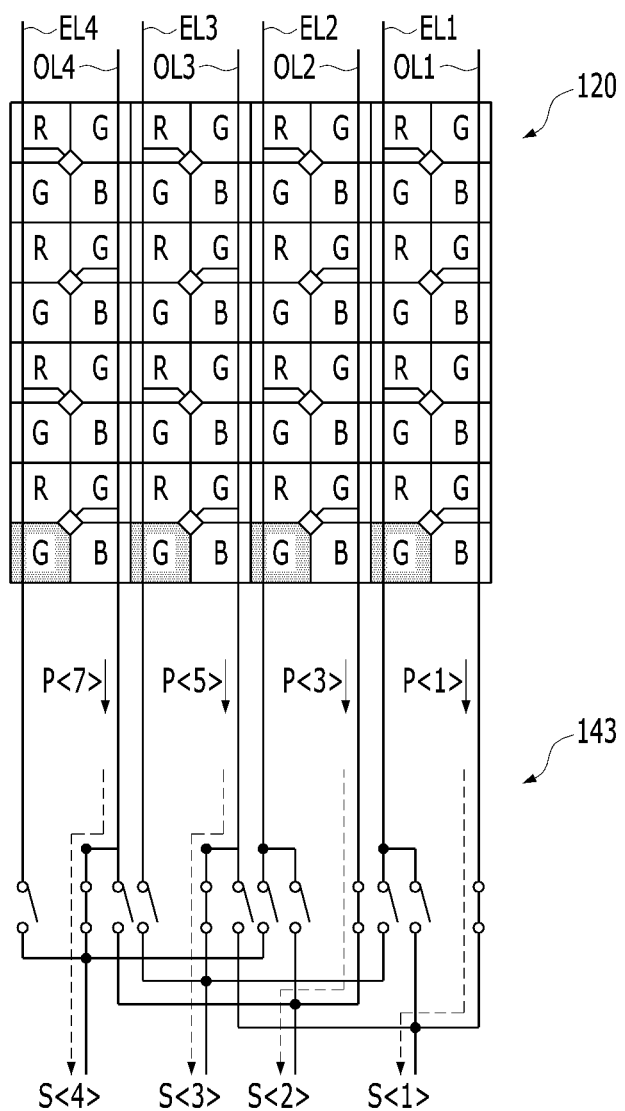
FIGS. 4 and 5 are diagrams for describing an operation of the image sensor illustrated in FIG. 1 according to a normal mode in accordance with an embodiment of the present disclosure.
Figure 5:
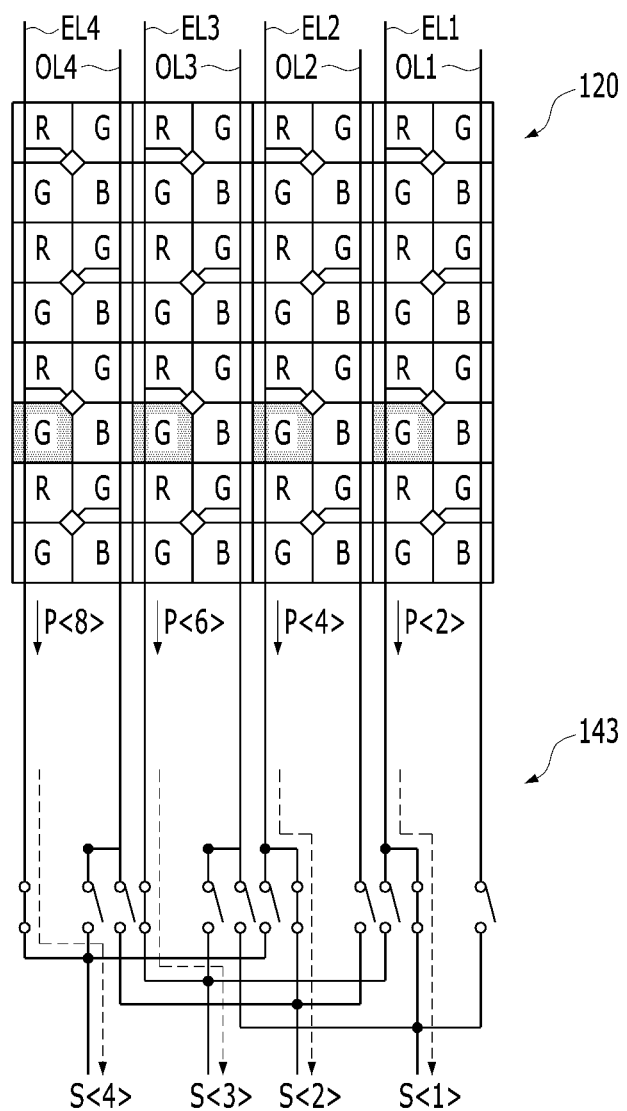

FIGS. 4 and 5 are diagrams for describing the operation of the image sensor 100 according to the normal mode in accordance with an embodiment of the present disclosure.

Referring to FIG. 4, the image sensor 100 may output the first pixel signal P<1>, the third pixel signal P<3>, the fifth pixel signal P<5> and the seventh pixel signal P<7>, which are generated from the first to fourth unit pixel circuits, as first to fourth selection pixel signals S<1:4> through the odd-numbered readout lines OL1 to OL4 during a first single row time. For example, the image sensor 100 may generate the first pixel signal P<1>, the third pixel signal P<3>, the fifth pixel signal P<5> and the seventh pixel signal P<7> from pixels each having a green filter G among the pixels included in the first to fourth unit pixel circuits, and then sequentially generate the first pixel signal P<1>, the third pixel signal P<3>, the fifth pixel signal P<5> and the seventh pixel signal P<7> from pixels having other color filters R, G and B during the first single row time.

Referring to FIG. 5, the image sensor 100 may output the second pixel signal P<2>, the fourth pixel signal P<4>, the sixth pixel signal P<6> and the eighth pixel signal P<8>, which are generated from the fifth to eighth unit pixel circuits, as first to fourth selection pixel signals S<1:4> through the even-numbered readout lines EL1 to EL4 during a second single row time. For example, the image sensor 100 may generate the second pixel signal P<2>, the fourth pixel signal P<4>, the sixth pixel signal P<6> and the eighth pixel signal P<8> from pixels each having a green filters G among the pixels included in the fifth to eighth unit pixel circuits, and then sequentially generate the second pixel signal P<2>, the fourth pixel signal P<4>, the sixth pixel signal P<6> and the eighth pixel signal P<8> from pixels having other color filters R, G and B during the second single row time.

Figure 6:
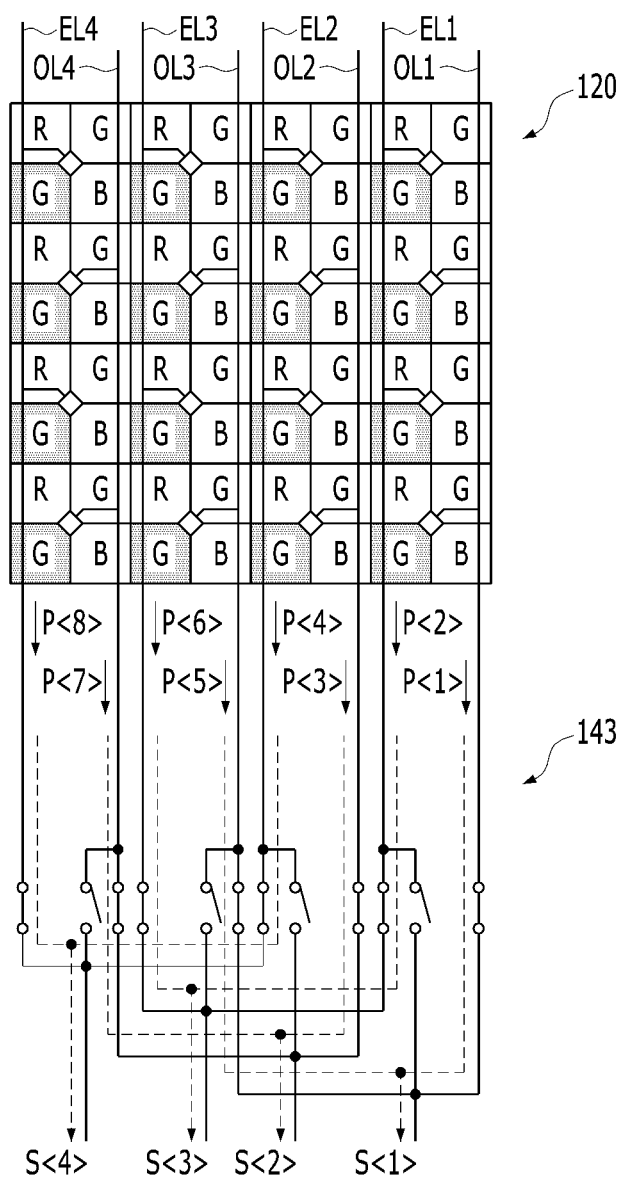
FIG. 6 is a diagram for describing the operation of the image sensor illustrated in FIG. 1 according to a binning mode in accordance with an embodiment of the present disclosure.

FIG. 6 is a diagram for describing the operation of the image sensor 100 according to the binning mode in accordance with an embodiment of the present disclosure.

Referring to FIG. 6, the image sensor 100 may simultaneously output pixel signals, which correspond to pixels having the same color filter, from first to sixteenth unit pixel circuits. For example, the image sensor 100 may perform an analog binning operation, i.e., an averaging operation, on pixel signals generated from the first unit pixel circuit, the third unit pixel circuit, the ninth unit pixel circuit and the $11^{th}$ unit pixel circuit to output the pixel signals as a first selection pixel signal S<1>, perform the analog binning operation, i.e., the averaging operation, on pixel signals generated from the second unit pixel circuit, the fourth unit pixel circuit, the $10^{th}$ unit pixel circuit and the $12^{th}$ unit pixel circuit to output the pixel signals as a second selection pixel signal S<2>, perform the analog binning operation, i.e., the averaging operation, on pixel signals generated from the fifth unit pixel circuit, the seventh unit pixel circuit, the $13^{th}$ unit pixel circuit and the $15^{th}$ unit pixel circuit to output the pixel signals as a third selection pixel signal S<3>, and perform the analog binning operation, i.e., the averaging operation, on pixel signals generated from the sixth unit pixel circuit, the eighth unit pixel circuit, the $14^{th}$ unit pixel circuit and the $16^{th}$ unit pixel circuit to output the pixel signals as a fourth selection pixel signal S<4>.

According to an embodiment of the present disclosure as described above, an analog binning operation in a horizontal direction as well as an analog binning operation in a vertical direction may be performed, and the number of bias circuits and the number of bias switches may be optimized according to design intent.

According to an embodiment of the present disclosure, an analog binning operation in a horizontal direction is performed in a binning mode, which makes it possible to improve a frame rate.

Furthermore, according to an embodiment of the present disclosure, a bias generator and a path selector necessary for reading out pixel signals are optimized, which makes it possible to achieve a low area design and ease of design or to improve a readout speed.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure and the following claims. Furthermore, the embodiments may be combined to from additional embodiments.

What is claimed is:

1. An image sensor comprising:
   a first pixel group including first to fourth unit pixel circuits arranged in at least one row;
   a second pixel group including fifth to eighth unit pixel circuits arranged in at least one other row;
   a third pixel group including ninth to $12^{th}$ unit pixel circuits arranged in at least one other row;
   a fourth pixel group including $13^{th}$ to $16^{th}$ unit pixel circuits arranged in at least one other row;
   a first readout line disposed in a first column and connected to the first unit pixel circuit and the ninth unit pixel circuit;
   a second readout line disposed in a second column and connected to the fifth unit pixel circuit and the $13^{th}$ unit pixel circuit;
   a third readout line disposed in a third column and connected to the second unit pixel circuit and the $10^{th}$ unit pixel circuit;
   a fourth readout line disposed in a fourth column and connected to the sixth unit pixel circuit and the $14^{th}$ unit pixel circuit;
   a fifth readout line disposed in a fifth column and connected to the third unit pixel circuit and the $11^{th}$ unit pixel circuit;
   a sixth readout line disposed in a sixth column and connected to the seventh unit pixel circuit and the $15^{th}$ unit pixel circuit;
   a seventh readout line disposed in a seventh column and connected to the fourth unit pixel circuit and the $12^{th}$ unit pixel circuit;
   an eighth readout line disposed in an eighth column and connected to the eighth unit pixel circuit and the $16^{th}$ unit pixel circuit;
   first to fourth readout circuits; and
   a path selector suitable for, during a single row time in a binning mode, connecting the first to $16^{th}$ unit pixel circuits to the first to fourth readout circuits via the first to eighth readout lines and connecting at least two readout lines of the first to eighth readout lines to one readout circuit of the first to fourth readout circuits.

2. The image sensor of claim 1, wherein the path selector is further suitable for connecting one of the first to fourth pixel groups to the first to fourth readout circuits via a half of the first to eighth readout lines during the single row time in a normal mode.

3. The image sensor of claim 1,
   further comprising first to fourth bias circuits,
   wherein the path selector is further suitable for connecting the first to eighth readout lines to the first to fourth bias circuits during the single row time in the binning mode.

4. The image sensor of claim 3, wherein the path selector includes:
   a first path selection circuit suitable for selectively connecting the first to eighth readout lines to the first to fourth bias circuits on the basis of a plurality of first control signals; and
   a second path selection circuit suitable for selectively connecting the first to eighth readout lines to the first to fourth readout circuits on the basis of a plurality of second control signals.

5. The image sensor of claim 1,
   further comprising first to eighth bias circuits,
   wherein the path selector is further suitable for connecting the first to eighth readout lines to the first to eighth bias circuits, respectively, during the single row time in the binning mode.

6. The image sensor of claim 5, wherein the path selector includes:
   a first path selection circuit suitable for selectively connecting the first to eighth readout lines to the first to fourth bias circuits on the basis of a plurality of first control signals; and
   a second path selection circuit suitable for selectively connecting the first to eighth readout lines to the first to fourth readout circuits on the basis of a plurality of second control signals.

7. The image sensor of claim 1, the at least two readout lines are connected to an input terminal of the one readout circuit.

8. The image sensor of claim 1, wherein the path selector performs an analog binning operation on first to 16th unit pixel signals generated from the first to 16th unit pixel circuits to output first to fourth selection pixel signals to first to fourth readout circuits.

9. An image sensor comprising:
   a pixel array of N×M unit pixel circuits, where N≥2 and M≥N;
   K*N readout lines connected to the N×M unit pixel circuits of the pixel array, where K≥2;
   a signal converter including N readout circuits; and
   a path selector suitable for, during a single row time in a binning mode, connecting at least two readout lines of the K*N readout lines to one readout circuit of N readout circuits when connecting the N×M unit pixel circuits of the pixel array to the N readout circuits via the K*N readout lines and connecting the N×M unit pixel circuits of the pixel array to the N readout circuits by connecting at least four unit pixel circuits arranged in at least two rows among the N×M unit pixel circuits of the pixel array to one of the N readout circuits.

10. The image sensor of claim 9, wherein the path selector is further suitable for connecting N×1 unit pixel circuits among the N×M unit pixel circuits of the pixel array to the N readout circuits, respectively, via some or all of the K*N readout lines during the single row time in a normal mode.

11. The image sensor of claim 9,
    further comprising a bias generator including N bias circuits,
    wherein the path selector is further suitable for connecting the N×M unit pixel circuits of the pixel array to the N bias circuits via the K*N readout lines during the single row time in the binning mode.

12. The image sensor of claim 11, wherein the path selector includes:
    a first path selection circuit suitable for selectively connecting the K*N readout lines to the N bias circuits on the basis of a plurality of first control signals; and a second path selection circuit suitable for selectively connecting the K*N readout lines to the N readout circuits on the basis of a plurality of second control signals.

13. The image sensor of claim 9,
further comprising a bias generator including K*N bias circuits,
wherein the path selector is further suitable for connecting the N×M unit pixel circuits of the pixel array to the K*N bias circuits via the K*N readout lines during the single row time in the binning mode.

14. The image sensor of claim 13, wherein the path selector includes:
a first path selection circuit suitable for selectively connecting the K*N readout lines to the K*N bias circuits on the basis of a plurality of first control signals; and
a second path selection circuit suitable for selectively connecting the K*N readout lines to the N readout circuits on the basis of a plurality of second control signals.

* * * * *